United States Patent [19]
Pines

[11] 4,213,137
[45] Jul. 15, 1980

[54] MONOLITHIC VARIABLE SIZE DETECTOR

[75] Inventor: Michael Y. Pines, Los Angeles, Calif.

[73] Assignee: Hughes Aircraft Company, Culver City, Calif.

[21] Appl. No.: 742,316

[22] Filed: Nov. 16, 1976

[51] Int. Cl.$^2$ .................. H01L 27/14; H01L 31/00
[52] U.S. Cl. ............................ 357/30; 250/211 J; 250/340; 250/338; 307/304; 307/311; 357/24
[58] Field of Search ............ 357/24, 30; 307/304, 307/311; 250/211 J, 332, 334, 338, 340

[56] References Cited

U.S. PATENT DOCUMENTS

| | | | |
|---|---|---|---|
| 3,660,697 | 5/1972 | Berglund et al. | 357/24 |
| 3,771,149 | 11/1973 | Collins et al. | 357/24 |
| 3,808,435 | 4/1974 | Bate et al. | 357/24 |
| 3,845,295 | 10/1974 | Williams et al. | 357/24 |
| 3,849,651 | 11/1974 | Ennulat | 357/24 |
| 3,883,437 | 5/1975 | Nummedal et al. | 357/24 |
| 3,896,474 | 7/1975 | Amelio et al. | 357/24 |
| 3,896,485 | 7/1975 | Early | 357/24 |
| 3,902,066 | 8/1975 | Roosild et al. | 357/24 |

FOREIGN PATENT DOCUMENTS

2439799  3/1975  Fed. Rep. of Germany ............ 357/24

OTHER PUBLICATIONS

Nelson, Applied Physics Letters, vol. 10, 11-1974, pp. 568-570.

*Primary Examiner*—S. C. Buczinski
*Attorney, Agent, or Firm*—George Tacticos; W. H. MacAllister

[57] ABSTRACT

There is disclosed an all silicon monolithic focal plane array of variable size infrared detectors for image detection. The structure comprises two epitaxial layers grown on an extrinsically doped silicon substrate. The detectors are formed in and extend through the substrate, the material of which is sensitive to specific wavelength infrared signals according to the dopant used in the substrate. The collection of charges takes place on a first buried layer formed around a portion of the first epitaxial layer-substrate interface, and the charges are then transferred through a third buried layer of the same conductivity type to a conducting surface layer on the upper portion of the second epitaxial layer. A second buried layer in a second portion of the epitaxial layer-substrate interface connected through a fourth buried layer to a surface layer provides a means for controlling the size of the detector region. The signal readout function is performed by a charge coupled device shift register constructed in the second epitaxial layer and includes selectively spaced electrodes in an insulating layer. Carriers generated in the detector by incident infrared radiation are collected into the first buried layer and then pass through the third buried layer to the surface layer and they are injected therefrom into the CCD shift register and are detected at the output.

12 Claims, 2 Drawing Figures

MONOLITHIC VARIABLE SIZE DETECTOR

FIELD OF THE INVENTION

This invention relates generally to radiation detectors and more particularly to a monolithic extrinsic silicon infrared detector containing a CCD structure to perform the signal readout functions of the device. The detector has two epitaxial layers and a CCD structure constructed on a portion of the second epitaxial layer.

RELATED APPLICATIONS

In a copending U.S. patent application by R. M. Finnila et al, Ser. No. 614,277, filed Sept. 17, 1975, and entitled "Monolithic Extrinsic Silicon Infrared Detectors With Charge Coupled Device Readout," and assigned to the present assignee, there is disclosed and generically claimed a broad new class of IR detectors and related fabrication processes wherein, among other things, the IR detector and associated CCD circuitry for the signal readout function are combined in a novel manner to produce a monolithic extrinsic silicon detector structure.

In another copending application by R. M. Finnila et al, Ser. No. 702,548, filed July 6, 1976, now U.S. Pat. No. 4,142,198, and entitled "Monolithic Extrinsic Silicon Infrared Detectors With an Improved Charge Collection Structure," and assigned to the present assignee, there is disclosed and generically claimed another new class of IR detectors and related fabrication processes, wherein among other things new collection structures are used to collect and transfer the charges produced in the detector elements.

In yet another copending application by R. M. Finnila et al, Ser. No. 720,865, filed Sept. 7, 1976, entitled "Monolithic Extrinsic Silicon Infrared Detector Structure Employing Multi-Epitaxial Layers," and assigned to the present assignee, there is disclosed and generically claimed yet another new class of IR detectors and related fabrication processes, wherein among other things, two epitaxial layers and a degenerate buried layer between portions of the epitaxial layers are used to improve the isolation of the detector region from the CCD readout circuitry.

BACKGROUND OF THE INVENTION

The present invention relates generally to imagers having a focal plane array of infrared detectors and charge coupled device signal processing circuitry associated with the detectors to transfer the signals produced by the detectors into data processing apparatus. In this apparatus the image may be reconstructed from the signals in a manner determined by the particular mode of scanning employed. Imagers of this general type are disclosed, for example, in the following U.S. Pat. Nos.

B. K. Weimer, 3,683,193;
Y. Takamura, 3,777,061;
D. R. Collins, 3,771,149;
K. Nummedal, 3,883,437.

In the prior art, of which the foregoing patents are typical, efforts to integrate the photodetectors of such an array with a charge coupled circuitry have in the past led either to hybrid devices wherein the detectors were mounted on top of a separate semiconductor substrate in which the charge coupled circuitry was contained or to an arrangement wherein the photodetectors were formed as portions of the same semiconductor substrate containing the charge coupled circuitry.

The device disclosed and claimed in copending application Ser. No. 614,277, represents a successful monolithic integration of the detector and its associated CCD circuitry into one efficient and low-cost device. In the fabrication of this earlier structure disclosed in Ser. No. 614,277, an epitaxial layer is formed on an IR detector substrate and then a portion of that epitaxial layer is etched away as to permit infrared radiation to impinge on the individual detectors of the substrate. This produces charges which are then read out by direct injection into the charge coupled device which is built on the epitaxial layer and functions to transfer charges through the epitaxial layer and into the output of the device.

The device disclosed and claimed in copending application Ser. No. 702,548, eliminates the need for having a portion of the epitaxial layer etched away. It instead uses different means for collecting charges generated in the detector elements and injecting them into the CCD circuitry. Among the charge collection structures disclosed was the use of a conducting buried layer and conducting surface layer combination for the collection and transfer of charges from the detector elements to the CCD circuitry.

The device disclosed and claimed in copending application Ser. No. 720,865 comprises two epitaxial layers grown on a surface of an extrinsically doped silicon substrate. The CCD readout circuit is built in a portion of the second epitaxial layer. Between portions of the two epitaxial layers and just below the CCD circuit there is a degeneratively doped shield layer to isolate the underlying detector region from the CCD operation. Infrared radiation can reach the detector region by entering either through the epitaxial layers or by entering through a detector electrode in the opposite end of the detector. The generated carriers are collected and transferred through the use of a collection structure involving a first degeneratively doped buried layer in a portion of the interface between the first epitaxial layer and the detector region and a third degeneratively doped buried layer that connects the first buried layer with a degeneratively doped first surface layer. This device has an improved fill factor and improved signal-to-noise ratio over its prior art counterparts.

While the inventions by R. M. Finnila et al. disclosed and claimed in the aforementioned patent applications represent significant advances in this art as explained in detail in said applications, my present invention further and substantially extends the developments and advances in this area of technology. The present invention has the further advantages of improving the flexibility of the device for applications requiring periodic adjustments of resolution versus sensitivity. It provides for a device that can give a variable resolution and which can be adjusted to trade off resolution at the expense of sensitivity or vice versa.

SUMMARY OF THE INVENTION

The general purpose of this invention is to provide a new and improved image detector, having most if not all of the advantages and features of similarly employed devices, while eliminating many of the disadvantages of prior art structures.

To accomplish this purpose, I have provided a novel structure including an image detector operable to generate electrical charge signals in response to optical radiation impinging from either its frontside or back-side. This detector includes means for processing said signals comprising a charge coupled signal collecting device for transferring charge to a utilization circuit and further having means controlling the effective size of the optical detector region and thus the signal and resolution of the structure.

This structure comprises a semiconductor substrate of a first conductivity type having a first and second epitaxial layer adjacent to said semiconductor substrate and having a second type of conductivity. The substrate includes an optical detector region formed in at least a portion of the semiconductor substrate capable for generating charge in response to received radiation. A conducting layer of a second conductivity type is in the vicinity of a predetermined portion of the interface between the first and second epitaxial layers for shielding the substrate from the charge coupled device. The structure further includes means adjacent to the semiconductor substrate for the transfer of charge from the optical detector region to a predetermined portion of the second epitaxial layer. It further includes means adjacent the semiconductor substrate for controlling the effective size of the optical detector region. An insulating layer of dielectric material is on the top of the second epitaxial layer and a plurality of electrode means are spaced from the second epitaxial layer by at least a portion of this insulating layer. These electrode means are for processing charge generated in the optical detector region and for moving it along the second epitaxial layer to a utilization circuit in response to cyclical voltage applied to the electrode means. Such voltage controls the potential profile in the second epitaxial layer.

Accordingly, it is an object of the present invention to provide a new and improved monolithic extrinsic silicon optical detector.

A more specific object is to provide a monolithic extrinsic silicon optical detector with an adjustable resolution and sensitivity.

A further object is to provide an improved and flexible infrared silicon detector that can give a variable resolution and which can be adjusted to trade off resolution at the expense of sensitivity.

A feature of this invention is the provision of a monolithic extrinsic silicon detector with a series of interconnected surface and buried layers operative to adjust the effective detector area of the structure.

These and other objects and features of the invention will become apparent in the following description taken in conjunction with the accompanying drawings.

DETAILED DESCRIPTION OF DRAWINGS

Figure 1:
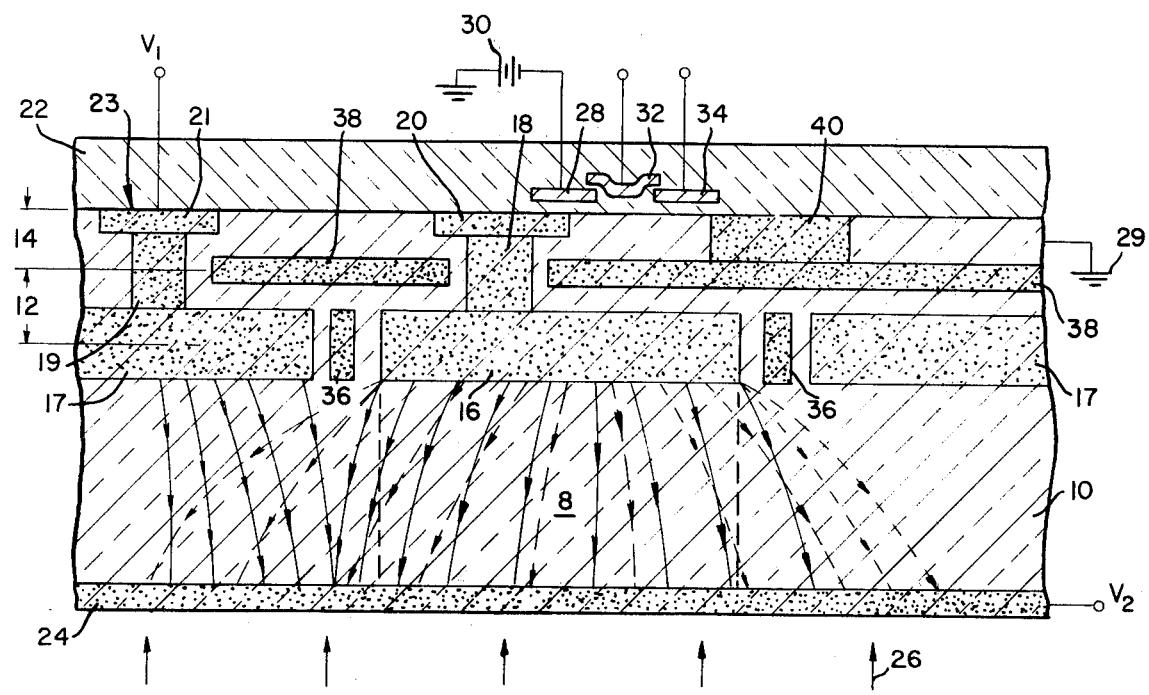
FIG. 1 is a diagrammatic cross-sectional view of an image detector device embodying the present invention. It includes first and second buried layers and a first surface layer to transfer the charges from the detector element to the CCD circuitry. It further includes a third and fourth buried layer and a second surface layer to control the effective size of the detector element. It has a shield region between portions of the two epitaxial layers and a channel stop layer. It also includes additional buried layers in the first epitaxial layer-substrate interface to prevent autodoping between adjacent buried layers.

Referring now to FIG. 1, there is shown a cross-sectional view of an infrared detector constructed in accordance with the present invention. Each detector element 8 is formed in a semiconductor substrate 10 and extends through it. For example, the substrate 10 may be extrinsic silicon doped with gallium atoms to a concentration of approximately $3 \times 10^{16}$ atoms per cm$^3$. Other P-type dopants such as indium, thalium, selenium, titanium, zinc, etc., may also be used to produce a P-type substrate. A first epitaxial layer 12 is formed of N-type silicon adjacent the silicon substrate 10 and a second epitaxial layer 14 is formed of N-type silicon adjacent the first epitaxial layer. Infrared radiation can pass through both epitaxial layers to reach the detector element 8. The epitaxial layers may be doped with phosphorous to prevent carrier freeze-out at operating temperatures. The second epitaxial layer 14 is used for the CCD circuitry. The CCD may be a two-phase structure with overlapping polycrystalline silicon gate electrodes. A first P+ buried layer 16 is formed on a portion of the first epitaxial layer-substrate interface and in the vicinity of the detector element. A second P+ buried layer 17 is formed on another portion of the first epitaxial layer-substrate interface. These two layers are usually formed prior to the deposition of the first epitaxial layer and they may be made by doping predetermined portions of the substrate with a P-type impurity, such as, for example, boron. These P+ layers should be degenerately doped with a typical concentration of over $5 \times 10^{18}$ atoms/cm$^3$ such that carriers will not freeze-out completely at the device operating temperature (10°–20° K.). Yet they should not be so heavily doped as to hinder the later epitaxial deposition operation. These P+ buried layers will out-diffuse into the epitaxial layer during subsequent processing steps. A third degenerately doped P+ layer 18 and a fourth degenerately doped P+ layer 19 are formed on predetermined portions of the interface between the first and second epitaxial layers in a way as to be electrically connected to the first and second P+ buried layers, respectively. These layers may also be formed by the degenerately doping of predetermined portions of the first epitaxial layer with a P-type impurity such as, for example boron, prior to the deposition of the second epitaxial layer. A first P+ surface layer 20 is formed in a way as to be electrically connected to the P+ buried layer 18 at zero bias voltage. A second P+ surface layer 21 is connected with the P+ buried layer 19. This surface layer 21 is externally connected to a voltage supply V$_1$. Carriers generated in the initially frozen-out Si:Ga substrate by IR irradiation will be collected by the first P+ buried layer 16 and injected under appropriate biasing conditions through the third P+ buried layer and the first P+ surface layer into the CCD signal processing circuitry.

A layer of insulating material 22 is formed on the top of the second epitaxial layer 14. A diffused layer 24 is formed on the back side of the substrate 10. Layer 24 is also referred to as a detector electrode, and is connected to a source of positive voltage V$_2$. The second epitaxial layer 14 is normally connected to a ground 28.

A plurality of electrodes are disposed in the insulating layer 22 and the fields generated by the drive voltages applied to these electrodes cooperate with the second epitaxial layer 14 to define the functioning of the charge coupled device readout circuitry.

A series of isolation buried layers 36 are provided in predetermined portions of the interface between the substrate and the first epitaxial layer. They are N+ regions for a P-type detector. These N+ regions are made through the heavy doping of predetermined portions of the substrate with an N-type impurity such as phosphorous. The purpose of these layers is to insure isolation between adjacent P+ buried layers and help prevent autodoping between the P+ layers during the first epitaxial layer deposition.

Infrared radiation 26 enters through the detector electrode 24 to strike the photodetector element 8 and thereby generate a charge in detector 8. The charge, holes in this case, will be collected by the P+ buried layer 16 and injected through the third P+ buried layer 18 and the first P+ surface layer 20 into the readout circuitry. Adjacent the surface element 20 is a bias electrode 28 to which negative bias from battery 30 is applied. Next to the bias electrode 28 there is a transfer gate electrode 32 and next to it an input electrode 34 of a CCD shift register. The bias electrode, transfer gate electrode and the CCD electrodes are all made through conventional techniques using polycrystalline silicon or appropriate metals such as aluminum. Alternatively, polycrystalline silicon may be used to make the set of electrodes that are relatively close to the epitaxial layer and aluminum for the set of electrodes further from the epitaxial layer. The effective size of the detector element 8 is determined by the strength of the electric field lines between buried gate 16 and the detector electrode 24. However there is another electric field in the vicinity set up between the second P+ buried layer 17 and the detector electrode 24. By adjusting the voltage $V_1$ the field lines of the detector are constricted or expanded. Thus by varying $V_1$ the effective size of the detector region is determined. In combination P+ layers 21, 19 and 17, depicted together as 23, constitute an example of means through which the effective size of the optical detector region can be controlled.

A conducting buried layer should be used to shield the CCD operation from the substrate. For a P-channel CCD this shield layer 38 is N+ and is located at the portion of the first epitaxial layer-second epitaxial layer interface directly under the CCD. This N+ buried layer enables the room temperature testing of CCD devices even on a thin (i.e. 3–4 μm) epitaxial layer. From the CCD register 34 the charge goes into an MOS output/reset circuit. The device also has an N+ channel stop diffusion 40.

There is usually a linear array of photodetector elements and they are either used with an optical scanner or they are moved in any convenient manner relative to the scene to be imaged. From each of the photodetector elements 8 a charge transfer path leads orthogonally away from the row of photodetectors to the charge coupled device shift register 34 at the rear of the device which extends in a direction parallel to the row of photodetectors for final readout. Charge is read onto the CCD shift register in parallel and is read out in series.

The details of circuit configuration and mode of operation of the signal readout function, including the operation of the bias electrode, transfer gate and the CCD shift register, have been more fully set forth and explained in a copending application by R. M. Finnila et al, Ser. No. 614,277, filed Sept. 17, 1975, and assigned to the present assignee. The device claimed in the above-referenced application uses, like the present invention, a CCD circuit for the processing of the readout signal.

Figure 2:
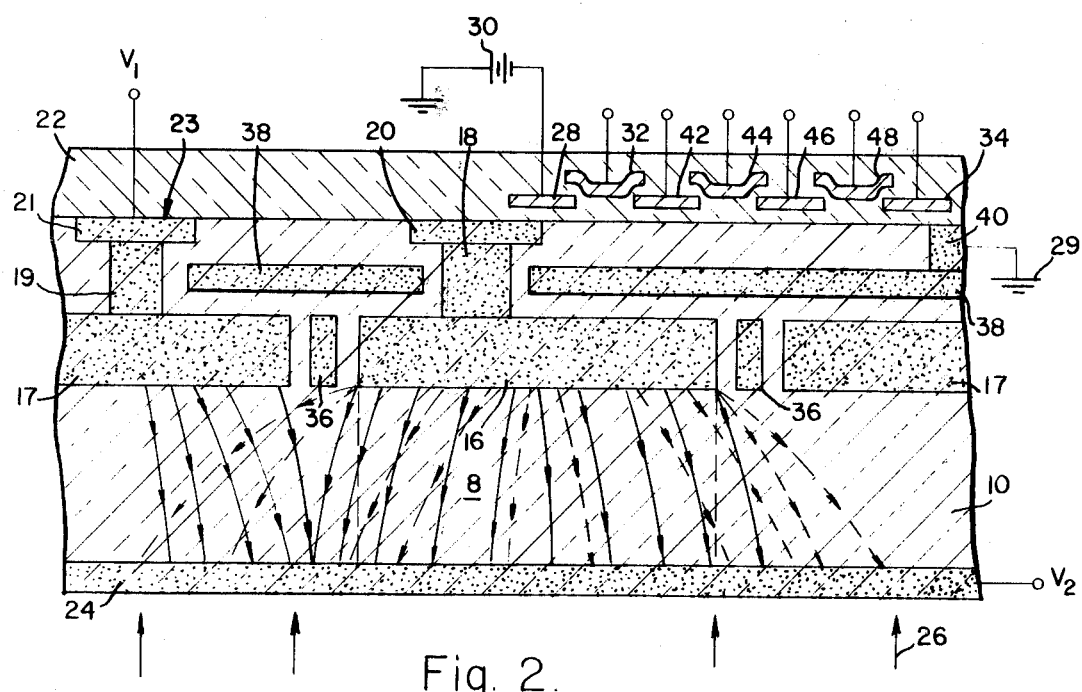
FIG. 2 is a diagrammatic cross-sectional view of the detector depicted in FIG. 1, which further includes a bucket background subtraction (BBS) circuitry.

Referring now to FIG. 2, there is shown an IR detector similar to the one shown in FIG. 1 with the addition of a bucket background subtraction circuit (BBS). A more detailed description of the configuration and mode of operation of a bucket background subtraction circuit can be found in U.S. Pat. No. 3,969,634, which is also assigned to the present assignee and is entitled "Bucket Background Subtraction Circuit for Charge Coupled Devices." From reference to that patent it will be seen that the purpose of this portion of the circuitry which may optionally be used in this or other similar imaging devices is to reduce the background or DC component level of the charge signal being supplied to the shift register 34 in order to reduce the charge handling requirements imposed on the shift register. With the detector electrode 24 at an appropriate positive voltage and the bias electrode 28 at an appropriate negative voltage, the detector element 8 is biased to act as a photodetector. The holes generated in the P-type detector element 8, by the incidence of infrared radiation 26 and initially collected in the first buried layer 16, will be transferred through the third buried layer 18. From here these charges are transferred through the first surface layer 20 and then, under the influence of the bias electrode 28 and the transfer gate 32, will fill the background charge storage potential well under electrode 42. The signal charge then overflows the BBS storage potential barrier which is controlled by the control gate 44 and flows into the signal storage section under electrode 46. The second transfer gate 48 will then clock the charge into the CCD shift register 34 where it is shifted to the output end as described above in connection with FIG. 1. The addition of the BBS circuitry to this basic device affords protection against charge overload in a high IR background environment in a manner more fully explained in U.S. Pat. No. 3,969,634, but is not otherwise necessary to the operation of the basic device.

For devices constructed in accordance with this invention radiation may penetrate the device from either the front or the back side.

The N+ and P+ regions are regions that are so heavily doped with appropriate impurities as to be degenerate or essentially metallic. When a phrase such as a degenerate region, or a heavily doped region is used in this specification to describe a semiconductor region, it refers to a region that has a doping density high enough to move the Fermi level of the material into the conduction or valance band.

Using this invention, both P-type and N-type image detectors can be constructed. Although most discussion in this specification focuses around the P-type detector having a P-type substrate, two N-type epitaxial layers, five P+ buried layers, two P+ surface layers, a P-channel CCD, an N+ shield layer between sections of the two epitaxial layers, an N+ channel stop layer, the same principles equally apply to an N-type detector with an N-type substrate, two P-type epitaxial layers, five N+ buried layers two N+ surface layers, an N-channel CCD and a P+ shield layer. For an N-type infrared detector arsenic may be used as a substrate dopant. The selection of the dopant for the substrate depends on the ultimate use of the detector. For example, indium or gallium may be used for the infrared range of 3–5 micrometers. Gallium may also be used for the infrared range of 8–14 micrometers. Arsenic may be used for applications in the range above 14 micrometers. Other dopants can be used for the different ranges of the optical spectrum.

Although most of the discussion in this specification focuses on embodiments of the invention made for the detection of infrared radiation, the invention is not limited to infrared detectors but to optical detectors in general. The selection of the substrate dopant determines the ultimate wavelength sensitivity of the detector.

What is claimed is:

1. In an image detector of the type having at least one optical detector operable to generate electrical charge signals in response to optical radiation, and having means for processing said signals comprising a charge coupled signal collecting device for transferring charge to a utilization circuit, the improvement comprising:
    (a) a semiconductor substrate of a first conductivity type having first and second adjacent epitaxial layers of a second conductivity type monolithically formed thereon;
    (b) at least one optical detector region formed in said substrate and having at least one surface accessible to optical radiation and operative to generate charge in response to received radiation;
    (c) a degeneratively doped layer of a second conductivity type disposed in the vicinity of a predetermined portion of the interface between said first epitaxial layer and said second epitaxial layer, whereby said degeneratively doped layer shields said substrate from said charge coupled device;
    (d) means adjacent to said semiconductor substrate for collecting and transferring charge from a predetermined portion of said semiconductor substrate to a predetermined portion of said second epitaxial layer;
    (e) means adjacent to said semiconductor substrate for controlling the effective size of said optical detector region;
    (f) an insulating layer of dielectric material formed on said second epitaxial layer;
    (g) a plurality of electrode means spaced from said second epitaxial layer by at least a portion of said insulating layer for forming said charge coupled signal processing device in said insulating and second epitaxial layers to transfer signal charges from said detector element through said collection and transfer means and through said second epitaxial layer to said utilization circuit in response to cyclical voltage applied to said electrode means to thereby control the potential profile in said second epitaxial layer.

2. A device as set forth in claim 1 wherein said substrate contains a detector electrode formed through the relatively heavy doping of a substrate surface opposite to that on which said epitaxial layers are formed, by a conductivity determining impurity of a first type of conductivity whereby each of said detector elements extends from said detector electrode through said substrate to said means for the collection and transfer of charge.

3. A device as set forth in claim 2 wherein said means for the collection and transfer of charge from said substrate to said second epitaxial layer comprise:
    (a) a first buried layer, heavily doped with a conductivity determining impurity of a first type, spatially disposed in the vicinity of a predetermined portion of the substrate-first epitaxial layer interface;
    (b) a third buried layer, heavily doped with a conductivity determining impurity of a first type formed in predetermined portions of said first and said second epitaxial layers and adjacent a portion of said first buried layer;
    (c) a first surface layer, heavily doped with a conductivity determining impurity of a first type formed in a predetermined portion of said second epitaxial layer and extending between a predetermined portion of said second buried layer and a predetermined portion of said insulating layer.

4. A device as set forth in claim 3 wherein said means for controlling the effective size of said optical detector region comprise:
    (a) a second buried layer, heavily doped with a conductivity determining impurity of a first conductivity type, spatially disposed in the vicinity of a predetermined portion of the substrate-first epitaxial layer interface and adjacent but not connected with said first buried layer;
    (b) a fourth buried layer, heavily doped with a conductivity determining impurity of a first conductivity type formed in predetermined portions of said first and said second epitaxial layers and adjacent a portion of said third buried layer;
    (c) a second surface layer, heavily doped with a conductivity determining impurity of a first conductivity type formed in a predetermined portion of said second epitaxial layer and extending between a predetermined portion of said fourth buried layer and a predetermined portion of said insulating layer.

5. A device as set forth in claim 4 wherein each of said detectors has operatively associated with it a charge coupled signal collecting device which extends in said second epitaxial layer in a direction orthogonal to a line scanner.

6. A device as set forth in claim 5 wherein all of said charge coupled signal collecting devices feed charge signals in parallel into a common serially operated charge coupled shift register.

7. A device as set forth in claim 5 wherein each of said signal collecting devices includes background subtraction circuit means for removing a uniform image background representing D.C. component from said charge signal transmitted through it.

8. A device as set forth in claim 5 which further includes a surface channel stop layer formed in a predetermined section of said second epitaxial layer by heavy doping with a conductivity determining impurity of a second type.

9. A device as set forth in claim 5 which further includes a fifth buried layer heavily doped with a conductivity determining impurity of a second type, formed in the vicinity of a predetermined portion of said substrate first epitaxial layer interface whereby said fifth buried layer improves the isolation between said first and second buried layers.

10. An image detector including in combination
    (a) a semiconductor substrate of a first conductivity type having at least one optical detector region for generating charge in response to received radiation;
    (b) a first epitaxial layer adjacent to said semiconductor substrate and having a second type of conductivity;

(c) a second epitaxial layer adjacent to said first epitaxial layer and having a second type of conductivity;

(d) means adjacent to said semiconductor substrate for the collection and transfer of charge from said optical detector region to said second epitaxial layer;

(e) means adjacent to said semiconductor substrate for controlling the effective size of said optical detector region;

(f) an insulating layer of dielectric material formed on an exposed surface of said second epitaxial layer;

(g) a plurality of electrode means spaced from said second epitaxial layer by at least a portion of said insulating layer for processing charge generated in said optical detector region and moving it along said second epitaxial layer to a utilization circuit;

(h) a degenerately doped shield layer in the vicinity of a predetermined portion of the interface between said first and said second epitaxial layers and having a second type conductivity whereby said shield layer isolates said substrate from the operation of said electrode means.

11. A device as set forth in claim 10 wherein said means for the collection and transfer of charge from said substrate to said second epitaxial layer comprise:

(a) a first buried layer, heavily doped with a conductivity determining impurity of a first conductivity type, and disposed over a predetermined portion of said optical detector region;

(b) a third buried layer, heavily doped with a conductivity determining impurity of a first conductivity type formed in a predetermined portion of said first epitaxial layer-second epitaxial layer interface and adjacent said first buried layer;

(c) a first surface layer, heavily doped with a conductivity determining impurity of a first conductivity type formed in a predetermined portion of said second epitaxial layer and adjacent to said second buried layer whereby under proper biasing conditions said first buried layer collects and transfers charges generated in adjoining portions of said detector region in response to received radiation through said second buried layer and through said surface layer to said second epitaxial layer and a utilization circuit.

12. A device as set forth in claim 11 wherein said means for controlling the effective size of said optical detector region comprise:

(a) a second buried layer, heavily doped with a conductivity determining impurity of a first conductivity type, and disposed over a predetermined portion of said optical detector region adjacent said first buried layer but not connected with it;

(b) a fourth buried layer, heavily doped with a conductivity determining impurity of a first conductivity type formed in a predetermined portion of said first epitaxial layer-second epitaxial layer interface and adjacent said third buried layer;

(c) a second surface layer, heavily doped with a conductivity determining impurity of a first conductivity type formed in a predetermined portion of said second epitaxial layer and adjacent to said fourth buried layer whereby under proper biasing conditions said fourth buried layer affects the electric field in said detector region and the portion of the detector region from which charges can be attracted into said first buried layer.

* * * * *